United States Patent [19]
Pai

[11] Patent Number: 5,407,763
[45] Date of Patent: Apr. 18, 1995

[54] MASK ALIGNMENT MARK SYSTEM

[75] Inventor: Deepak K. Pai, Burnsville, Minn.

[73] Assignee: Ceridian Corporation, Bloomington, Minn.

[21] Appl. No.: 889,667

[22] Filed: May 28, 1992

[51] Int. Cl.$^6$ .............................................. G03F 9/00
[52] U.S. Cl. .......................................... 430/5; 430/22; 356/401
[58] Field of Search ....................... 430/22, 5; 356/401

[56] References Cited

U.S. PATENT DOCUMENTS

| | | | |
|---|---|---|---|
| 3,697,318 | 10/1972 | Feinberg et al. | 117/212 |
| 4,003,745 | 1/1977 | Blanks | 96/41 |
| 4,060,643 | 11/1977 | Blanks | 428/195 |
| 4,343,877 | 8/1982 | Chiang | 430/5 |
| 4,343,878 | 8/1982 | Chiang | 430/5 |
| 4,423,127 | 12/1983 | Fujimura | 430/12 |
| 4,442,188 | 4/1984 | Chiang | 430/5 |
| 4,777,117 | 10/1988 | Murata et al. | 430/293 |
| 4,883,359 | 11/1989 | Ina et al. | 356/401 |
| 5,004,658 | 4/1991 | Hjulstrom | 430/5 |

OTHER PUBLICATIONS

"Multichip Modules for High Performance Military Electronics," T. A. Krinki and D. K. Pai, Electrecon '91 Proceedings, Oct. 22-23, 1991, pp. 19-48.

Primary Examiner—John Kight, III
Assistant Examiner—R. F. Johnson
Attorney, Agent, or Firm—Kinney & Lange

[57] ABSTRACT

An alignment mark system and method of using the same wherein each mask of a sequence of masks includes a mask sequence indicium, a first alignment feature and a second alignment feature spaced from the first alignment feature. Each of the mask sequence indicium, the first alignment feature and the second alignment feature produce a corresponding structure as a result of the photolithographic process. The structure resulting from the second alignment feature is aligned with the first alignment feature of the immediately succeeding mask for proper alignment of the mask sequence.

24 Claims, 3 Drawing Sheets

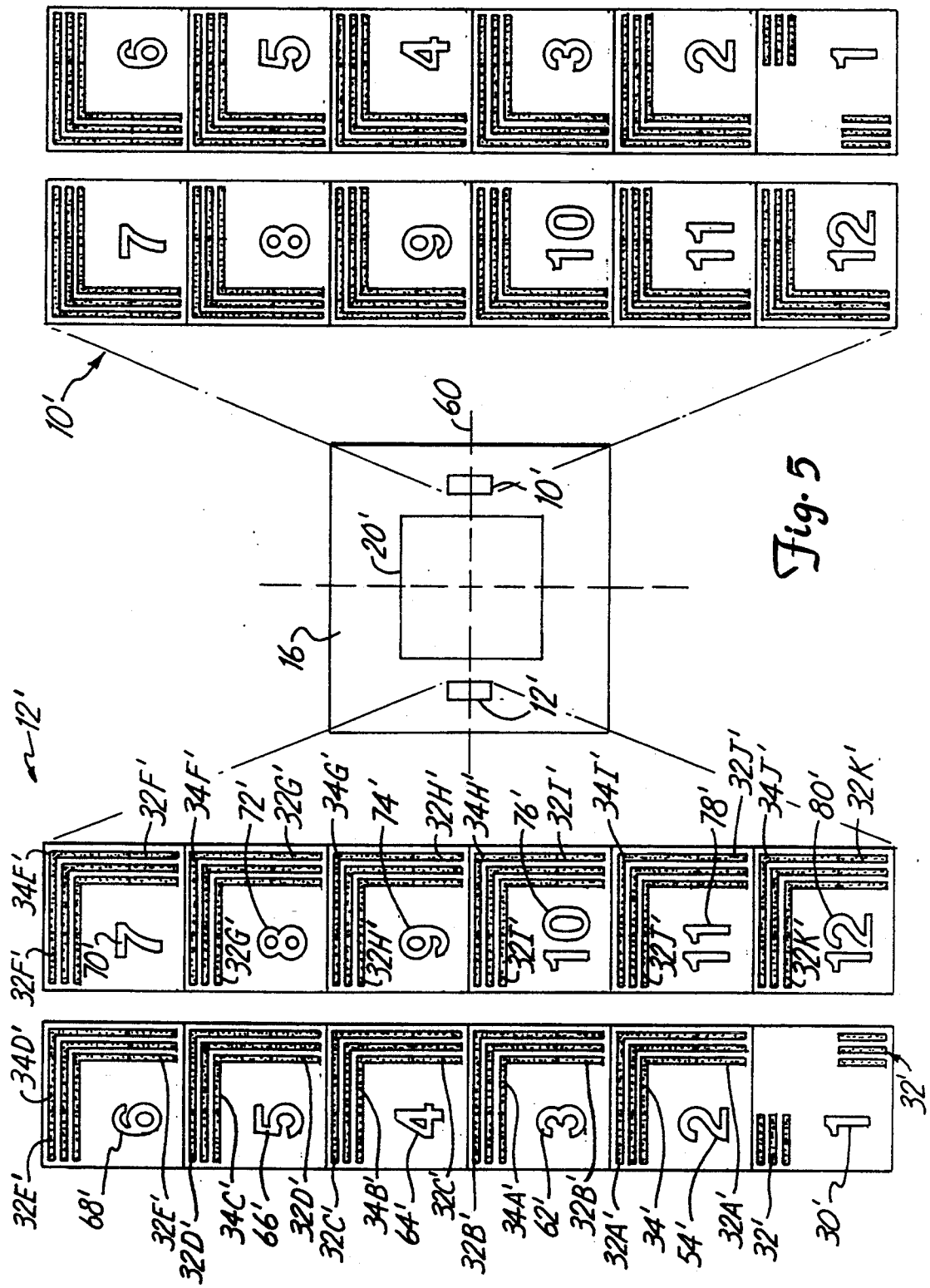

MASK ALIGNMENT MARK SYSTEM

BACKGROUND OF THE INVENTION

The present invention relates to photolithographic processing systems and, more particularly, to a system for designing and using photomasks for use in semiconductor processing technology.

Thin film technology has been used for electrical interconnection of integrated circuits and discrete components. This thin film technology involves the use of high conductivity metal films that are deposited on a substrate. The term "thin film" is used to describe approximate film thickness of 0.0002 inch or less, compared to the larger geometry and thicker films associated with hybrid integrated circuits. In addition to providing electrical interconnection of integrated components, thin film circuits are also used to form resistor or capacitor structures on the substrate by deposition of resistive or dielectric thin film layers.

Thin film technology is particularly well suited to high speed systems which require a high packaging density. The use of thin film technology for these systems, instead of the more traditional printed wiring board technology (PWB), provides reduced interconnection distances between the integrated components and low capacitance interconnects, both of which enhance the system performance. A general discussion of the use of thin film technology is found in the article entitled "Multi-chip Modules for High Performance Military Electronics," Electrecon '91 Proceedings sponsored by the Electronics Manufacturing Productivity Facility, Indianapolis, Ind., Oct. 27 and 23, 1991, incorporated herein by reference.

Thin film processing technology for transforming a substrate into an electrical interconnection or module for integrated circuits and discrete components involves a complex sequence of process steps which must be accurately performed to produce a high yield of these large and relatively expensive modules. Thin film processing technology involves photolithography steps which are utilized to produce patterned masking layers on the substrate which in turn are utilized to create different layers of conductive film, resistors, capacitors, and vias for interconnecting different layers of conducting film. A typical thin film process involves a number of sequential photolithography operations, each of which must be performed in its proper sequence and with proper process control to produce a good thin film module. If one of the photomasks is utilized out of sequence, the thin film module will be defective.

As discussed previously, thin film technology frequency uses multiple layers of thin film conducting material. These thin film conducting layers are separated by a dielectric material such as polyimide. Connections between various layers of conductive film are accomplished with a vertical interconnection frequently referred to as a "via." These vias are frequently formed by defining the via locations using a photomask and plating a conductive material, thereby forming the vertical interconnection to selected conductive layers that are aligned with this via. The method of forming vias is known and therefore will not be discussed here in detail. However, it is apparent that the alignment of the conductive films at various layers in the module is essential to via formation. If any layer of conductive film is misaligned relative to any other layer of conductive film, the via will not be properly formed at the correct location and therefore an electrical interconnection will not occur when the via is plated with a conductive material. Therefore, the alignment of each photomask that is used in the photolithographic process is essential to ensure that each conductive layer is properly aligned so that the electrical interconnection occurs at correct locations.

Previous methods used to align these photomasks have employed an alignment cross on each photomask. A cross pattern is deposited onto the structure during the same deposition forming the mask feature. The photomask for the next step, and each subsequent processing step, is aligned by positioning that mask's cross over the cross structure defined by the alignment cross of the previous photomask. A slight misalignment occurs in a lower layer of the structure, the alignment mask is blurred and subsequent masks are often misaligned, forming structures that are misaligned. In addition, the dimension of the cross structure formed by the processing steps is frequently larger in dimension than the corresponding cross on the photomask because of growth. Growth is a known phenomenon of the deposition process that results in the structure defined by the photomask having larger dimensions than the corresponding structures on the photomask. As a result of this growth, the alignment of photomasks becomes more difficult because the cross on the photomask must be aligned with each of the prior cross structures that are not only possibly slightly misaligned, but also may be larger due to growth.

In addition to growth and slight misalignment of the mask, there are other problems that make it difficult to align a series of masks each of which has a cross structure that is superimposed. As previously discussed, a dielectric material is placed over each conductive layer to insulate that conductive layer or film from the next sequential conductive layer or film. This dielectric material is frequently cured by baking which often times causes shrinking or contraction. As this dielectric material shrinks, the entire substrate may tend to warp or bow. Because the patterns of conductive film of each layer adds some stress to the substrate, and because these patterns of conductive film at various layers are not uniform, the stress acting on the substrate as a result of the dielectric curing is also non-uniform thereby causing substrate bowing or warping. Warping or bowing of the substrate changes the flatness of the substrate relative to the mask resulting in changes in spacing between alignment marks on the mask and patterns of conductive film defined by the mask. The changes in spacing due to warping tends to blur cross structures defined by previous masks thereby making mask alignment more difficult.

There is a present need for mask alignment systems for aligning a sequence of photomasks with the structures produced by the previous photomasks. The ideal mask alignment system should enable an operator to align masks even if substrate bowing or warping occurs. In addition, an ideal mask alignment system should allow mask alignment personnel to readily determine the mask sequence, thereby preventing a mask layer from either being missed or being used out of order. Finally, this ideal mask alignment system should permit subsequent quality review of each mask alignment of the process.

SUMMARY OF THE INVENTION

The present invention is an intermediate mask suited for use with a prearranged sequence of masks in a photolithographic system to form structures of an electric circuit or module. The mask includes a mask sequence indicium means for indicating the mask position in the sequence. Also included is a first alignment feature for defining a first structure corresponding to the first alignment feature. A second alignment feature is included that is spaced from the first alignment feature. The second alignment feature is for defining a second structure corresponding to the second alignment feature. The second structure is suited for alignment with a first alignment feature of a succeeding mask. The first alignment feature of the intermediate mask is arranged for alignment with a second structure defined by the second alignment feature of a preceding mask.

BRIEF DESCRIPTION OF THE DRAWINGS

FIG. 5 is a top plan view of a completed electric circuit showing a pair of mask alignment features greatly enlarged.

DETAILED DESCRIPTION OF THE PREFERRED EMBODIMENTS

Figure 1:
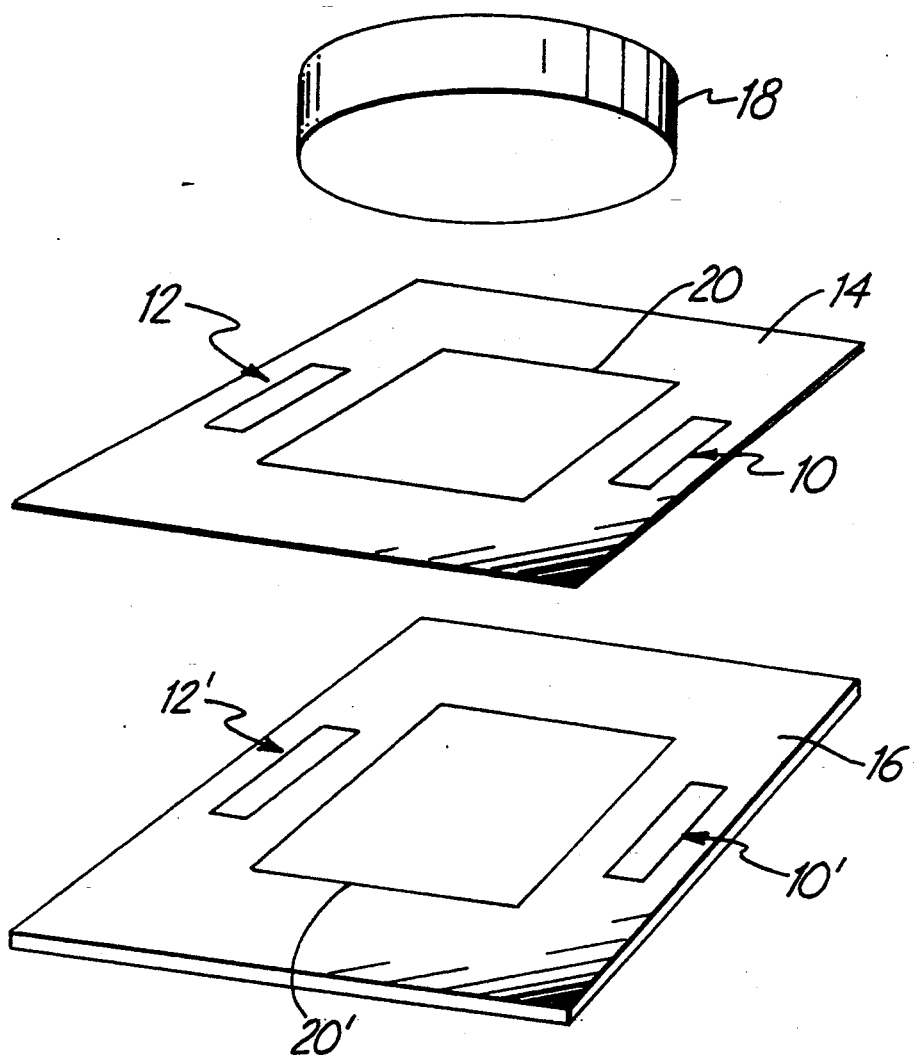
FIG. 1 is a perspective view of a photolithographic system for transferring patterns on a mask to a surface.

Depicted in FIG. 1 is a pair of mask alignment mark systems 10 and 12 of the present invention for use in a process involving the photographic transfer of patterns on a mask 14 to a surface 16. In one preferred embodiment, the photographic transfer is performed with a photolithographic process that makes use of an ultraviolet (UV) light source 18 to expose a photosensitive coating known as a photoresist or resist on surface 16. Photolithographic processes are known and therefore will not be described in great detail. Mask 14 is disposed between the UV light source 18 and surface 16 to selectively expose portions of the photoresist on surface 16. If a negative acting photoresist is used, the portions of the photosensitive resist not covered by the opaque portion of the mask polymerize and harden after exposure. The unexposed parts of the resist can then be dissolved and washed away, leaving a photoresist mask on the surface 16 of the substrate. If a positive acting resist is used, the portions under the opaque sections of the mask are left to define a photoresist mask on the surface 16.

The photoresist mask is then used to define a particular conductor, semiconductor or insulator layer. The conductor layer is provided by a deposition process such as plating. The plating operation is used to apply a conductor layer to the conductive seed portions exposed by the photoresist mask. In this manner, a series of masks 14 can be used in a predetermined sequence to define several different layers of conductive material on the surface 16 of the substrate.

The mask 14 has a circuit topography pattern portion 20 that corresponds to the various layers of metal interconnection, bonding pads, and passive elements that provide the electrical interconnection between integrated elements. The mask alignment mark systems 10 and 12 are positioned on mask 14 separate from the circuit topography patterns 20. The photolithographic processing results in a structure 20' defined on the substrate surface 16 based on the circuit topography pattern 20 of each mask 14 of the sequence of masks. In addition, the photolithographic processing defines structures 10' and 12' corresponding to the mask alignment mark systems 10 and 12, respectively, on mask 14. The mask alignment mark systems 10 and 12 are separated from the circuit topography patterns 20 on mask 14 so that the completed electric circuit portion or module 20' has an area that is minimized. The electric circuit portion 20' on surface 16 of the substrate is then separated from the mask alignment structures 10' and 12' so that the area of the electrical interconnection portion is minimized.

The formation of a completed electric circuit portion 20' frequently requires ten or more separate masks 14 in the process of defining the many layers that make up the electric circuit portion 20'. Because various layers of the electric circuit portion 20' are frequency interconnected, a critical step in the fabrication of electric circuit portion 20' is the alignment of each mask 14 of the sequence of masks with structures on the substrate surface 16 defined by previous masking steps.

The processing steps to form a thin film electric circuit 20' will be described briefly to illustrate the necessity of the alignment of each mask 14 in the sequence of masks. The substrate surface 16 must first be properly lapped and cleaned. The substrate material that is frequently selected for thin film circuits is one of the following materials: alumina ($Al_2O_3$), beryllia (BeO), aluminum nitride (AlN), silicone carbide (SiC), silicone, a composite, or metal such as aluminum, stainless steel, copper and copper/molybdenum/copper. After the substrate surface 16 is properly prepared, a conductive seed layer is applied to the substrate surface 16. This seed layer is either titanium or copper, or some other suitable material known to those in the art. The seed layer is frequently applied with a sputtering process and is used to promote adhesion of the conductive layer or for providing a barrier metal layer to the substrate. A photoresist or resist is then applied to the substrate surface 16. The first mask 14 is then positioned between the ultraviolet light source 18 and the substrate surface 16. The mask 14 in one preferred embodiment is a thin layer of glass that has a layer of chromium that is selectively applied to the surface representing the opaque regions of the mask 14.

The photoresist on the substrate surface 16 is then exposed to ultraviolet light provided by UV light source 18. The portions of the photosensitive resist not covered by the opaque portions of the mask 14 polymerize and harden after exposure in the case of a negative photoresist. The unexposed parts of the resist can then be dissolved and washed away, leaving a photoresist mask on the substrate surface 16. Next, a plating operation is performed to plate a conductive material such as copper which bonds to the exposed conductive seed layers forming one of the conductive layers of the thin film electric circuit 20'. The resist, to which the copper plating does adhere, is then removed from the substrate surface 16.

Next, a polyimide deposition is applied to the surface of substrate 16 to provide a dielectric material. The polyimide is cured in a baking operation, and lapping is performed to planarize this polyimide dielectric layer. Electrical connectors or vias that pass through the polyimide layer must be defined by a second masking operation. In this second masking operation, a photoresist layer applied to the polyimide surface and a second mask 14 of the sequence of masks is positioned between the UV light source 18 and the substrate surface 16. The second mask must be properly aligned relative to the conductive layer defined by the first mask so that the vias defined by the second mask properly align with this first conductive layer. The photoresist is then exposed to ultraviolet light from the UV light source 18. The photoresist mask that is formed by selective exposure to UV light is used to define the polyimide insulating layer so that a subsequent plating operation can be performed to define vias.

The next layer of conductive material is applied to the substrate surface 16 by first applying a photoresist layer. A third mask 14 of the sequence of masks is then positioned between the ultraviolet light source 18 and the substrate surface 16. The third mask 14 must then be properly aligned with the substrate surface 16. More specifically, the third mask 14 must be aligned relative to the position of the previous mask so that interconnects or vias formed between two different conductive layers are properly aligned. Therefore, the third mask 14 must be aligned with the structure or conductive interconnection material deposited on the substrate surface 16 as a result of the previous mask operations. The alignment of the third mask 14 with the structures on the substrate surface 16 will be discussed in greater detail later. With the third mask 14 properly aligned over the surface of substrate 16, the photoresist is exposed to ultraviolet light from UV light source 18. The photoresist is selectively hardened by the UV light forming a photoresist mask that is used to define the next conductive layer or insulator layer on the surface of substrate 16.

Successive layers of conductive interconnection layers and vias for vertically interconnecting different layers are formed by repeating the previously described process steps. Each mask 14 of the sequence of masks must be properly aligned with the structure defined by each of the previous masks so that the vias are properly formed.

The mask alignment mark systems 10 and 12 which are the subject of the present invention will now be discussed in greater detail. The mask alignment mark systems 10 and 12 are shown generally in FIGS. 2 through 5. The mask alignment mark systems 10 and 12 are positioned on either side of the circuit topography pattern 20 of mask 14. Mask alignment mark system 10 and mask alignment mark system 12 are mirror images of each other and therefore the mask alignment mark system 12 will be described in greater detail. The description of mask alignment mark system 12 also applies to mask alignment mark system 10. Although the sequence of masks can be properly aligned using only mask alignment mark system 12, the preferred embodiment makes use of the mask alignment mark system 12 spaced from the mask alignment mark system 10.

Figure 2:
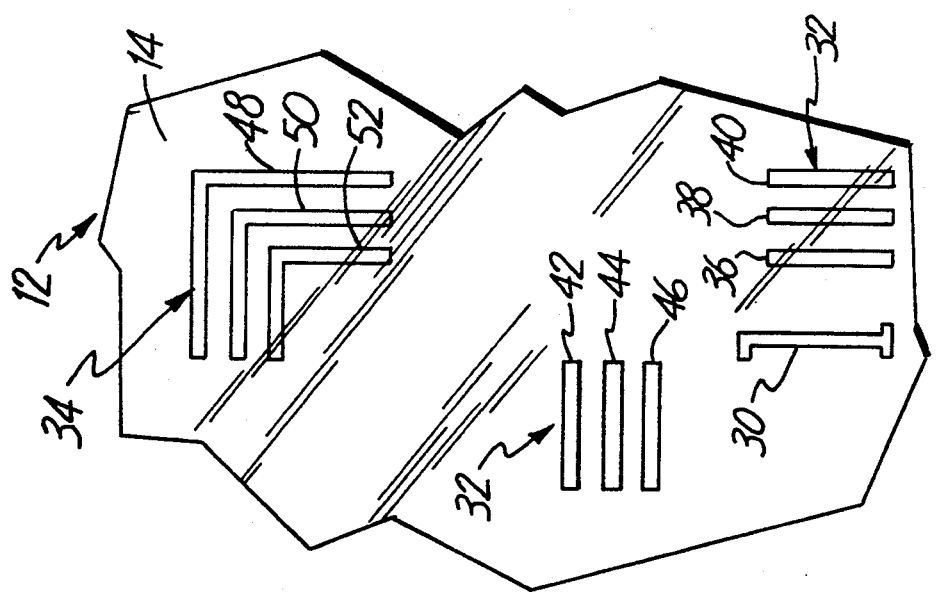
FIG. 2 is a top plan view of a first mask of a sequence of masks shown broken away to illustrate a mask sequence indicium, a first alignment feature and a second alignment feature.

FIG. 2 shows the mask alignment mark system 12 of the present invention for a first mask 14 of a sequence of masks that are used in the formation of the electric circuit or module 20'. The mask alignment mark system 12 which is positioned on the first mask 14 of the sequence of masks includes a mask sequence indicium 30, a first alignment feature 32, and a second alignment feature 34. The mask sequence indicium is a numeral indicating the mask position in the sequence of masks.

The first alignment feature 32 includes elongate rectangles 36, 38 and 40 with each of the elongate rectangles being spaced apart and having axes of elongation that are substantially parallel to one another. The first alignment feature further includes elongate rectangles 42, 44 and 46 that are spaced apart with each elongate rectangle having axes of elongation that are substantially parallel one another. Elongate rectangles 36, 38 and 40 are spaced apart from elongate rectangles 42, 44 and 46, and are oriented such that the axes of elongation for elongate rectangles 36, 38 and 40 are substantially perpendicular to the axes of elongation for elongate rectangles 42, 44 and 46.

The second alignment feature includes L-shaped portions 48, 50 and 52. Each of the L-shaped portions have leg portions that extend an equal distance from the intersection of the legs, with each of the leg portions being substantially perpendicular to one another. The leg portions of L-shaped portion 48 are longer than the leg portions of L-shaped portion 50. The length of the leg portion of L-shaped member 50 greater than the length of the leg portions of L-shaped member 52. The L-shaped portions 48, 50 and 52 are positioned with L-shaped portion 50 between and spaced equally from both of L-shaped portions 48 and 52. The lengths of the legs of each of the L-shaped portions 48, 50 and 52 are such that the ends of the legs are collinear.

The second alignment feature 34 is arranged relative to the first alignment feature 33 such that each of the legs of L-shaped portions 48, 50 and 52 extend in a direction that is generally parallel to one of the axes of elongation for rectangles 42, 44 and 46, and the axes of elongation for elongate rectangles 36, 38 and 40. In addition, the second alignment feature 34 is spaced from the first alignment feature 32 by an amount greater than the lengths of elongate rectangles 36, 38 and 40.

The minimum dimension for each of the mask sequence indicium 30, the first alignment feature 32 and the second alignment feature 34 is determined by the minimum line width capability of the photolithography process. The photolithography process has a minimum line width parameter that is used to specify the minimum line width achievable for a plated line on one of the conductive layers. The width of elongate rectangles 36, 38, 40, 42, 44 and 46 is equal or greater than the minimum line width specified by the photolithographic process. Similarly, the width of each of the leg portions of L-shaped members 48, 50 and 52 should be equal or greater than the minimum line width of the process. Additionally, mask sequence indicium 30 has a line width that is equal to or greater than the minimum line width specified by the photolithographic process.

Figure 3:
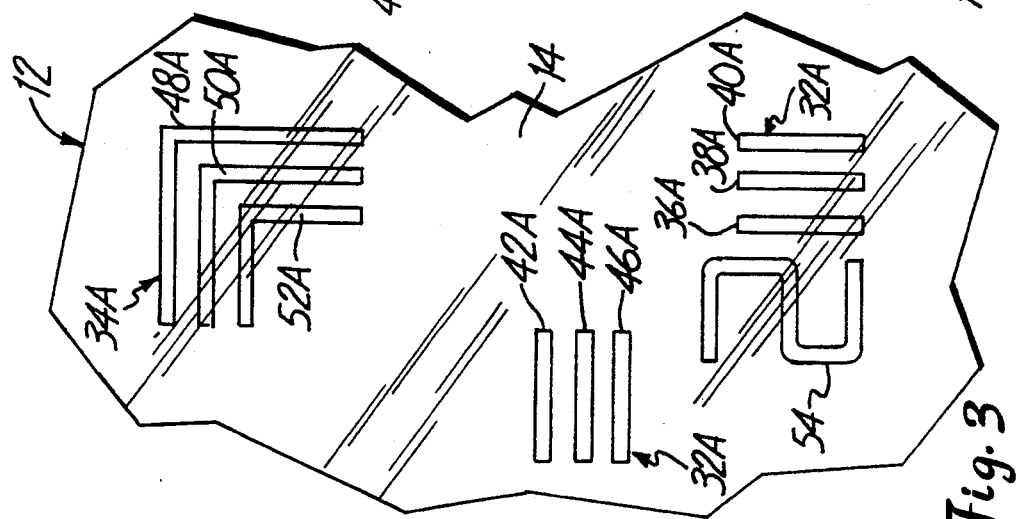
FIG. 3 is a top plan view of a second mask of a sequence of masks shown broken away to illustrate a mask sequence indicium, a first alignment feature and a second alignment feature.

The mask alignment mark for the second mask in a sequence of masks for the mask alignment mark system 12 of the present invention is shown in FIG. 3. The alignment mark for the second mask in the sequence is identical to the alignment mark for the first mask in the sequence except for the mask sequence indicium 54, which is different to indicate the second mask 14 in the sequence of masks. A common numbering system is used with reference to the alignment mark for the second mask to identify similar structures to the alignment mark of the first mask shown in FIG. 2.

The alignment mark for the second mask includes a mask sequence indicium 54, as previously discussed. In addition, the mask alignment mark for the second mark includes a first alignment feature 32A and a second alignment feature 34A. The first alignment feature 32A includes elongate rectangular portions 36A, 38A, 40A, 42A, 44A and 46A. These elongate rectangular portions are positioned adjacent the mask sequence indicium 54 and are arranged similarly to those of the first mask with the axes of elongation for elongate rectangles 36A, 38A and 40A being substantially perpendicular to the axes of elongation for elongate rectangular members 42A, 44A and 46A.

The second alignment feature 34A is spaced from the first alignment feature 32A. The second alignment feature 34A includes L-shaped members 48A, 50A and 52A. Each of the L-shaped members 48A, 50A and 52A are arranged similarly to the corresponding structure on the first mask layer, with L-shaped member 50A positioned between the equidistant each of L-shaped members 48A and 52A. The length of the leg portions for each of the L-shaped members 48A, 50A and 52A are such that the ends of each of the corresponding leg portions are collinear.

The width of each of the mask sequence indicium 54, each of the elongate rectangles 36A, 38A, 40A, 42A, 44A and 46A, and each of the L-shaped members 48A, 50A and 52A are each at least as wide as the minimum line width for the photolithographic process.

Figure 4:
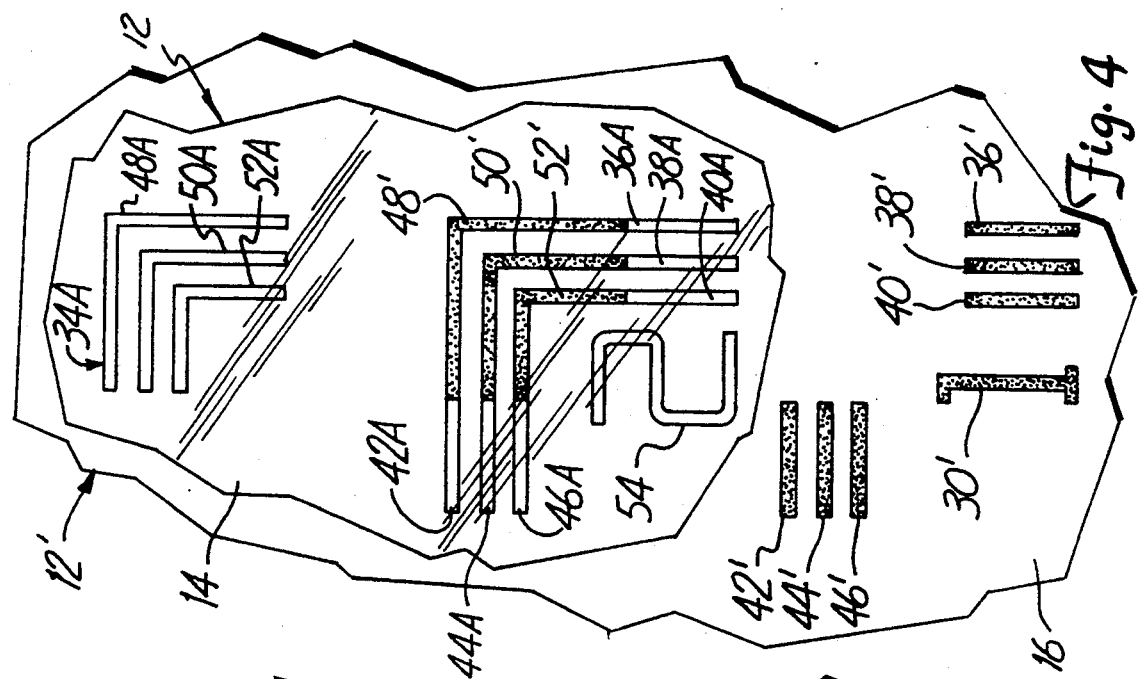
FIG. 4 is a top plan view shown in break away of the second mask properly positioned in relation to the structures defined by the first mask.

As shown in FIG. 4, the second mask 14 is positioned over the substrate surface 16. The substrate surface 16 has a first layer of conductive material previously applied using the first mask 14 in the photolithographic process previously described. The first layer on substrate 16 includes an alignment structure 12' that has a similar shape to alignment mask system 12 on mask 14, structure 12' being located on the surface 16 of the substrate. In a similar manner, each numbered portion of the alignment structure 12' corresponds to a mask alignment system 12 and designated by a corresponding alignment mark number with a prime designation. The alignment structure 12' defined by the first layer mask 14 of mask alignment mark system 12 include a mask sequence indicium structure 30', a first alignment structure 32' that includes elongate rectangular structures 36', 38', 40', 42', 44' and 46', and a second alignment structure 34' that includes L-shaped members 48', 50' and 52'.

The alignment structure 12' that is defined by the first mask 14 of alignment mark 12 shown in FIG. 2 is formed in one of two methods. One method is for each of the mask sequence indicium 30, the first alignment feature 32 and the second alignment feature 34 to be opaque portions of mask 14. The negative acting photoresist on the substrate surface 16 is then exposed to ultraviolet light from UV light source 18 to harden those portions of the photoresist not covered by the opaque portions. Subsequent deposition or plating operations are performed to define the structure 12' that correspond to each of the mask features 12. A second method is for each of the mask sequence indicium 30, the first alignment feature 32 and the second alignment feature 34 to be transparent portions of mask 14. The positive acting photoresist on the substrate surface 16 is then exposed to ultraviolet light to break down or soften those portions of the photoresist exposed to the ultraviolet light. In a similar manner to the previous method, deposition or plating are performed to define the alignment structure 12'.

The mask alignment mark systems 10 and 12 of the present invention, and corresponding alignment structures 10' and 12' defined therefrom, assists the operator in aligning various mask layers 14 with structures defined by previous mask layers on the surface 16 of the substrate. As shown in FIG. 4, the mask alignment of mark system 12 of the second mask 14 of a sequence of masks is shown properly aligned with the second alignment structure 12' on the substrate surface 16 is defined by a previous mask 14 shown in FIG. 2. The first alignment feature 32A of the second mask 14 of the sequence of masks is aligned with the structure 34' defined by the second alignment feature 34 of the previous mask 14 of the sequence of masks. More specifically, correct alignment between the second mask 14 and the surface of the substrate 16 occurs with the edge-matching of elongate rectangles 36A and 42A with the L-shaped structure 48', and the edge-matching of elongate rectangles 38A and 44A with L-shaped structure 50', and the edge-matching of elongate rectangles 40A and 46A with the L-shaped structure 52'. Because the legs of the L-shaped structures 34' are joined at an angle that is perpendicular, the alignment of the first alignment feature 32A with this structure aligns the second mask 14 in both a first dimension and a second dimension. Because the alignment mark system 12 on mask 14 is aligned in two dimensions with the alignment structure 12' on the substrate surface 16, the alignment mark system 10 is not required.

The second alignment feature 34A of the second mask 14 is used in the photolithographic process to define a second alignment structure (not shown) that is used to align the first alignment feature of the third mask in the sequence of masks. The alignment of the third mask 14 of the sequence of masks is similar to the alignment of the second mask 14 with the alignment structure 12' defined by the first mask previously discussed.

As shown in FIG. 4, the mask sequence indicium 54, the first alignment feature 32A and the second alignment feature 34A are each offset from the corresponding features of the previous mask. The mask sequence indicium 54 of the second mask 14 assists the operator in maintaining the proper sequence of masking steps. If an incorrect sequence of masks are used, it will be apparent to the operator that this has occurred.

Frequently, during the curing of the polyimide layer, the polyimide layer may tend to shrink. Because the stiffness of the substrate 16 is dependent on the various routing layers of conductive material which are generally non-uniform, forces acting on the substrate 16 may tend to cause the substrate to warp or bow. This bowing or warping of the substrate affects the substrate flatness relative to mask 14 which changes the spacing and dimensions of the structures defined by the mask resulting in alignment problems between the substrate surface 16 and the mask 14. As a result of the bowing of substrate 16, the alignment of the first alignment feature 32A of the second mask 14 with the second alignment structure 34' defined by the first mask may require some slight realignment. However, the slight realignment that may be required in realigning the second mask with the structure defined by the first mask does not obscure or blur the structure defined by the second mask that is used to align the third mask.

FIG. 5 shows a completed electric circuit or module 20' on substrate 16. The mask sequence alignment mark systems 10' and 12' are shown positioned at opposite sides and centered along a central axis 60 of the electric circuit or module 20'.

The electric circuit or module 20' has twelve different layers of metal interconnection and therefore requires twelve separate masks to define each of these layers. Associated with each of the twelve masks is a mask sequence indicium, a first alignment feature and a second alignment feature, each of which define a structure on the substrate surface 16. The first mask that is used to define the first layer of metal interconnection on electric circuit or module 20' also defines mask sequence indicium 30', first alignment structure 32' and second alignment structure 34' in the alignment structure 12'. The second mask defines a mask sequence indicium structure 54', first alignment structure 32A' and second alignment structure 34A'. The third mask defines a third mask sequence indicium 62', a first alignment structure 32B' and a second alignment structure 34B'. The fourth mask of the sequence of masks defines a fourth mask sequence indicium structure 64', a first alignment structure 32C' and a second alignment structure 34C'. The fifth mask defines a fifth mask sequence indicium structure 66', a first alignment structure 32D' and a second alignment structure 34D'. The sixth mask defines a sixth mask sequence indicium structure 68', a first alignment structure 32E' and a second alignment structure 34E'. The seventh mask in the sequence defines a seventh mask sequence indicium 70', a first alignment structure 32F' and a second alignment structure 34F'. The eighth mask in the sequence defines an eighth mask sequence indicium structure 72', a first alignment structure 32G' and a second alignment structure 34G'. The ninth mask in the sequence of masks defines a ninth mask sequence indicium structure 74', a first alignment structure 32H' and a second alignment structure 34H'. The tenth mask in the sequence of masks defines a tenth mask sequence indicium structure 76', a first alignment structure 32I' and a second alignment structure 34I'. The eleventh mask in the sequence of masks defines an eleventh mask sequence indicium structure 78', a first alignment structure 32J' and a second alignment structure 34J'. And finally, the twelfth mask in the sequence of masks defines a twelfth mask sequence indicium structure 80', a first alignment structure 32K'.

In operation, the first mask is positioned between the substrate surface 16 and the ultraviolet light source 18, and the photolithographic process is performed to define the first mask sequence indicium structure, a first alignment structure and a second alignment structure. The first alignment feature and each of the succeeding masks are aligned with the structure defined by the second alignment feature of the immediately preceding mask. In this manner, each of the masks in the sequence of masks is aligned with both the immediately preceding mask and the immediately succeeding mask thereby insuring alignment of all of the masks in the sequence of masks.

The present invention provides a mask sequence alignment mark system for insuring that all of the masks in the sequence of masks are properly aligned with all other masks in the sequence. In addition, the alignment mark system of the present invention, besides providing an alignment mark for alignment with the preceding mask, provides a second alignment mark that is offset from the first for defining a structure to allow alignment of the succeeding mask. Because the mask alignment system of the present invention offsets each alignment mark for the next mask, the problems of blurring associated with aligning all the masks to a single alignment mark that is superimposed is avoided. The present invention is described with respect to the fabrication of thin film circuits. However, this mask alignment system is suitable for other photolithographic processing technologies as well, such as silicon integrated circuit processing.

Although the present invention has been described with reference to preferred embodiments, workers skilled in the art will recognize that changes may be made in form and detail without departing from the spirit and scope of the invention.

What is claimed is:

1. A mask alignment mark system for use with a sequence of masks in a prearranged sequence in a photolithographic system, the mask alignment mark system including:

a first alignment feature on an intermediate mask for defining a corresponding first structure on a substrate;

a second alignment feature on a preceding mask for defining a corresponding second structure on the substrate, the first alignment feature of the intermediate mask being arranged for alignment with the second structure on the substrate with the first structure being offset from the second structure.

2. The mask alignment mark system of claim 1 wherein the first alignment feature on the intermediate mask further includes a first dimension alignment mark and a second dimension alignment mark for aligning the mask in a first dimension and a second dimension with the second structure on the substrate.

3. The mask alignment mark system of claim 1 further including a second alignment feature on the intermediate mask spaced from the first alignment feature for defining a corresponding second structure, the second alignment feature of the intermediate mask further includes a first dimension alignment mark and a second dimension alignment mark for defining a first dimension alignment structure on the substrate and a second dimension alignment structure on the substrate for aligning a first alignment feature of a succeeding mask in a first dimension and a second dimension.

4. The mask alignment mark system of claim 1 further including:

a first alignment feature of a succeeding mask, the first alignment feature of the succeeding mask including a first dimension alignment mark and a second dimension alignment mark each associated with the first alignment feature; and a second alignment feature on the intermediate mask including a first dimension alignment mark associated with the second alignment feature for defining a first dimension alignment structure on the substrate and a second dimension alignment mark associated with the second alignment feature for defining a second dimension alignment structure on the substrate, with the first dimension alignment mark of the succeeding mask aligned with the first dimension alignment structure on the substrate defined by the intermediate mask for aligning the succeeding mask in a first dimension and with the second dimension alignment mark of the succeeding mask aligned with the second dimension alignment structure on the substrate defined by the intermediate mask for aligning the succeeding mask in a second dimension.

5. The mask alignment mark system of claim 1 wherein the second alignment feature of the preceding mask further includes a first dimension alignment mark associated with the second alignment feature for defining a first dimension alignment structure on the substrate and a second dimension alignment mark associated with the second alignment feature for defining a second dimension alignment structure on the substrate and wherein the first alignment feature of the intermediate mask further includes a first dimension alignment mark and a second dimension alignment mark each associated with the first alignment feature, with the first dimension alignment mark of the intermediate mask aligned with the first dimension alignment structure on the substrate defined by the preceding mask for aligning the intermediate mask in a first dimension and with the second dimension alignment mark of the intermediate mask aligned with the second dimension alignment structure on the substrate defined by the preceding mask for aligning the intermediate mask in a second dimension.

6. The mask alignment mark system of claim 1 wherein each of the first alignment feature on the intermediate mask and the second alignment feature of the preceding mask further includes:
 a first line extending in a first dimension and having a first line width; and
 a second line extending in a second dimension and having a second line width, with the first line width and the second line width being at least as wide as a minimum feature size for the photolithographic system.

7. The mask alignment mark system of claim 6 wherein the first line is substantially perpendicular to the second line.

8. The mask alignment mark system of claim 1 and further including:
 a plurality of first alignment features on the intermediate mask for defining a plurality of first structures on the substrate; and
 a plurality of second alignment features on the preceding mask spaced from the first alignment features for defining a plurality of second structures on the substrate, with each of the plurality of second structures on the substrate aligned with each of the plurality of first alignment features of a succeeding mask and with each of the plurality of first alignment features for alignment with each of the plurality of second structures on the substrate defined by each of the plurality of second alignment features of a preceding mask.

9. The mask alignment mark system of claim 1 further including a mask sequence indicium on each of the preceding and intermediate masks indicating relative mask position in the sequence of masks, with the mask sequence indicium defining a sequence structure that is spaced from a mask sequence indicium of the succeeding mask and with the mask sequence indicium spaced from a sequence structure defined by a mask sequence indicium of the preceding mask.

10. The mask alignment mark system of claim 1 wherein the first alignment feature on the intermediate mask as well as the second alignment feature on the preceding mask each has at least a portion thereof forming an elongate structure on the substrate so as to edge match between the first alignment feature on the intermediate mask and the second alignment structure on the substrate.

11. The mask alignment mark system of claim 10 wherein sections of the elongate structure portion on the substrate defined by the first alignment feature on the intermediate mask and sections of the elongate structure portion on the substrate defined by the second alignment feature on the preceding mask are arranged substantially perpendicular to each other so as to edge match between the first alignment feature on the intermediate mask and the second alignment structure on the substrate in two dimensions.

12. The mask alignment mark system of claim 1 wherein each of the first alignment feature on the intermediate mask and the second alignment feature on the preceding mask include a pair of elongate features being arranged perpendicular so as to edge match between the first alignment feature on the intermediate mask and the second alignment structure on the substrate in two dimensions.

13. A mask alignment mark system for use with a sequence of masks in a photolithographic system for forming structures on a substrate, the mask alignment mark system including:
 a first mask including:
  a first mask sequence indicium for indicating mask position in the sequence;
  a second alignment feature for defining a second structure on the substrate associated with the first mask;
 a second mask successively following the first mask in the sequence including:
  a second mask sequence indicium for indicating mask position in the sequence;
  a first alignment feature for aligning the second mask with the second structure defined by the first mask, the first alignment feature of the second mask defining a first structure on the substrate associated with the second mask;
  a second alignment feature spaced from the first alignment feature for defining a second structure on the substrate associated with the second mask;
 a third mask successively following the second mask in sequence including:
  a third mask sequence indicium for indicating mask position in the sequence:
  a first alignment feature for aligning the third mask with the second structure on the substrate defined by the second mask, the first alignment feature of the third mask defining a first structure on the substrate associated with the third mask.

14. The mask alignment mark system of claim 13 wherein the first alignment feature of the second mask further includes a first dimension alignment mark and a second dimension alignment mark for aligning the second mask in a first dimension and a second dimension with the second structure on the substrate defined by the second alignment feature of the first mask.

15. The mask alignment mark system of claim 13 wherein the second alignment feature of the second mask further includes a first dimension alignment mark and a second dimension alignment mark for defining a first dimension alignment structure on the substrate and a second dimension alignment structure on the substrate for aligning the first alignment feature of the third mask in a first dimension and a second dimension.

16. The mask alignment mark system of claim 13 wherein the first alignment feature of the second mask further includes a first dimension alignment mark and a second dimension alignment mark each of which is associated with the first alignment feature and wherein the second alignment feature of the first mask further includes a first dimension alignment mark associated with the second alignment feature for defining a first dimension alignment structure on the substrate and a second dimension alignment mark associated with the second alignment feature for defining a second dimension alignment structure on the substrate, with the first dimension alignment mark of the second mask aligned with the first dimension alignment structure on the substrate defined by the first mask for aligning the second mask in a first dimension and with the second dimension alignment mark of the second mask aligned with the second dimension alignment structure on the substrate defined by the first mask for aligning the second mask in a second dimension.

17. The mask alignment mark system of claim 13 wherein the first alignment feature of the third mask further includes a first dimension alignment mark and a second dimension alignment mark each of which is associated with the first alignment feature and wherein the second alignment feature of the second mask further includes a first dimension alignment mark associated with the second alignment feature for defining a first dimension alignment structure on the substrate and a second dimension alignment structure on the substrate associated with the second alignment feature for defining a second dimension alignment structure on the substrate, with the first dimension alignment mark of the third mask aligned with the first dimension alignment structure on the substrate defined by the second mask for aligning the third mask in a first dimension and with the second dimension alignment mark of the third mask aligned with the second dimension alignment structure on the substrate defined by the second mask for aligning the third mask in a second dimension.

18. The mask alignment mark system of claim 13 wherein both the first alignment feature and the second alignment feature of each of the first mask, the second mask, and the third mask further includes:
a first line extending in a first dimension and having a first line width; and
a second line extending in a second dimension and having a second line width, with the first line width and the second line width being at least as wide as a minimum feature size for the photolithographic system.

19. The mask alignment mark system of claim 13 where in each of the first mask, the second mask, and the third mask further includes:
a plurality of first alignment features for defining a plurality of first structures on the substrate; and
a plurality of second alignment features spaced from the first alignment features for defining a plurality of second structures on the substrate.

20. A method for specifying mask sequence and relative mask alignment of masks used with a deposition process, the method comprising:

forming a mask sequence indicium on a substrate for each mask;
forming a first structure on the substrate corresponding to a first alignment feature on each mask;
forming a second structure on the substrate spaced from the first structure, the second structure corresponding to a second alignment feature on each mask, said first structure formed by a mask being formed in alignment with the second structure formed by the next preceding mask in the sequence.

21. The method for specifying mask sequence and relative mask alignment of masks of claim 20 and further comprising:
forming a first mask sequence indicium structure, a first alignment structure and a second alignment structure using a first mask;
aligning a second mask having a mask sequence indicium feature, a first alignment feature and a second alignment feature so that the first alignment feature of the second mask is in alignment with the second alignment structure defined by the first mask;
forming a mask sequence indicium structure, a first alignment structure and a second alignment structure using the aligned second mask; and
aligning a third mask having a mask sequence indicium feature, a first alignment feature and a second alignment feature so that the first alignment feature of the third mask is in alignment with the second alignment structure defined by the second mask.

22. In a set of photomasks adapted to be used during sequential photolithography processing steps in an overall process suited for defining structures on substrates, an alignment mark for aligning photomasks with structures defined by a previous photomask of the set of photomasks, the alignment mark of an intermediate photomask of the sequence comprising:
a first alignment mark portion; and
a second alignment mark portion, the first and second alignment mark portions being arranged for edge matching with first and second structure portions defined by a previous mask, the first and second alignment mark portions defining third and fourth structure portions in juxtaposition to the first and second structure portions.

23. The alignment mark of claim 22 further including a mask sequence indicium for indicating mask position in sequence of masks.

24. The alignment mark of claim 22 further including third and fourth alignment mark portions spaced from the first and second alignment mark portions, the third and fourth alignment mark portions defining fifth and sixth structures for edge matching with first and second alignment portions of a succeeding mask of the sequence, the first and second alignment portions of a succeeding mask defining seventh and eighth structure portions in juxtaposition to fifth and sixth structures defined by the third and fourth alignment mark portions of the intermediate mask.

* * * * *